US008692461B2

(12) United States Patent
Ha et al.

(10) Patent No.: US 8,692,461 B2
(45) Date of Patent: Apr. 8, 2014

(54) ORGANIC LIGHT EMITTING DIODE DISPLAY

(75) Inventors: Kuen-Dong Ha, Suwon-si (KR); Eui-Soon Lee, Suwon-si (KR); Jae-Yong Kim, Suwon-si (KR); Young-Jong Park, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 359 days.

(21) Appl. No.: 12/382,129

(22) Filed: Mar. 9, 2009

(65) Prior Publication Data

US 2009/0261718 A1    Oct. 22, 2009

(30) Foreign Application Priority Data

Apr. 17, 2008    (KR) .................. 10-2008-0035634

(51) Int. Cl.
*H01J 1/63* (2006.01)
(52) U.S. Cl.
USPC .......................................... 313/512; 313/504
(58) Field of Classification Search
CPC .. H01L 51/5243; H01L 51/524; H01L 51/529
USPC .................... 361/679.3, 679.36; 313/512
See application file for complete search history.

(56) References Cited

U.S. PATENT DOCUMENTS

| 6,097,602 A * | 8/2000 | Witchger ........................ 361/705 |
| 7,292,290 B2 * | 11/2007 | Miyagawa et al. ............. 349/58 |
| 2006/0002064 A1 * | 1/2006 | Oooka et al. .................. 361/681 |
| 2006/0114689 A1 * | 6/2006 | Chang et al. ................... 362/561 |
| 2006/0139271 A1 * | 6/2006 | Okuda ............................ 345/88 |
| 2007/0218411 A1 * | 9/2007 | Sakata ........................... 430/313 |

FOREIGN PATENT DOCUMENTS

| JP | 2007-108553 A | 4/2007 |
| JP | 2007-272107 | 10/2007 |
| KR | 1020050036719 A | 4/2005 |
| KR | 1020060078611 A | 7/2006 |
| KR | 10-2006-0088089 A | 8/2006 |

OTHER PUBLICATIONS

Abs. of JP 1173140.*
3M spec sheet Aug. 2001.*
Machine translation of JP11073140.*
Transmitter letter and Korean Notice of decision to grant a patent issued by Korean Patent Office on Nov. 28, 2009 corresponding to Korean Patent Application No. 10-2008-0035634.

* cited by examiner

*Primary Examiner* — Nimeshkumar Patel
*Assistant Examiner* — Jacob R Stern
(74) *Attorney, Agent, or Firm* — Robert E. Bushnell, Esq.

(57) ABSTRACT

An organic light emitting diode display includes a panel assembly for displaying an image and a first surface stress enhancing member arranged on a rear surface of the panel assembly. In one embodiment, the organic light emitting diode display includes a second surface stress enhancing member arranged on a front surface of the panel assembly. In anther embodiment, the organic light emitting diode display includes a lower bezel arranged on a rear surface of the first surface stress enhancing member and a shock absorption tape arranged between the first surface stress enhancing member and the lower bezel. The structure of the organic light emitting diode display efficiently prevents damages caused by an external impact.

11 Claims, 10 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on 17 Apr. 2008 and there duly assigned Serial No. 10-2008-0035634.

BACKGROUND OF THE INVENTION

1. Field of the Invention

The present disclosure relates to an organic light emitting diode (OLED) display. More particularly, the present disclosure relates to an OLED display that has improved mechanical strength against an external impact.

2. Description of the Related Art

Generally, a typical OLED display includes a panel assembly in which a plurality of OLEDs are formed, a bezel coupled to the panel assembly at a rear side of the panel assembly, and a printed circuit board (PCB) that is electrically connected to the panel assembly by a flexible printed circuit board (FPCB).

Unlike the LCD including a panel assembly having two thin substrates and liquid crystal filled in a space defined between these substrates, the OLED display is designed such that empty spaces exist in an inside of the panel assembly. Therefore, a mechanical strength of the OLED display is not sufficient.

Particularly, only the bezel functions to protect the panel assembly. That is, the conventional OLED display does not have a shock absorption member for absorbing an external impact. Therefore, when a user drops an electronic device that is equipped with an OLED display, a large twisting load and a large bending load are suddenly applied to the bezel and thus the bezel is deformed. As a result, the twisting and bending loads are directly transferred to the panel assembly coupled to the bezel and thus the panel assembly may be easily damaged.

The above information disclosed in this background section is only for enhancement of understanding of the background of the invention and therefore it may contain information that does not form the prior art that is already known in this country to a person of ordinary skill in the art.

SUMMARY OF THE INVENTION

Embodiments of the present disclosure provide an OLED display that is configured to increase mechanical strength against an external impact.

In an exemplary embodiment of the present disclosure, an organic light emitting diode display includes a panel assembly and a first surface stress enhancing member arranged on a rear surface of the panel assembly. The panel assembly includes a display region for displaying an image and a pad region. The display region includes a plurality of organic light emitting diodes for emitting light.

The organic light emitting diode display may further include a shock absorption tape arranged on a rear surface of the first surface stress enhancing member.

The shock absorption tape may include a shock absorption layer and an adhesive layer arranged on a surface of the shock absorption layer. The shock absorption layer may include a sponge or urethane.

The organic light emitting diode display may further include a second surface stress enhancing member arranged on a front surface of the panel assembly and a polarizing plate arranged on a front surface of the second surface stress enhancing member.

The organic light emitting diode display may further include a lower bezel arranged on the rear surface of the first surface stress enhancing member and a double-sided adhesive tape arranged between the first surface stress enhancing member and the lower bezel.

Alternatively, the organic light emitting diode display may further include a lower bezel arranged on a rear surface of the first surface stress enhancing member and a shock absorption tape arranged between the first surface stress enhancing member and the lower bezel.

The organic light emitting diode display may further include a second surface stress enhancing member arranged on a front surface of the panel assembly and a polarizing plate arranged on a front surface of the second surface stress enhancing member.

The lower bezel includes a bottom portion covering the rear surface of the first surface stress enhancing member and a sidewall located at edge portions of the bottom portion except for an edge portion corresponding to the pad region.

The organic light emitting diode display may further include an upper bezel arranged in a front surface of the panel assembly. The upper bezel may cover the pad region and be provided with an opening exposing the display region. The lower and upper bezels may be formed of metal or synthetic resin.

Each of the first and second surface stress enhancing members may include a hard coating layer and a pressure sensitive adhesive layer arranged on a surface of the hard coating layer.

According to the organic light emitting diode display of the exemplary embodiments, since the surface stress enhancing members are provided on the front and/or rear surface of the panel assembly, the impact resistance of the panel assembly is enhanced and thus the damage of the panel assembly can be prevented. In addition, the mechanical strength of the organic light emitting diode display is enhanced and thus the drop impact resistance can be further enhanced.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

The present disclosure will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

Figure 1:
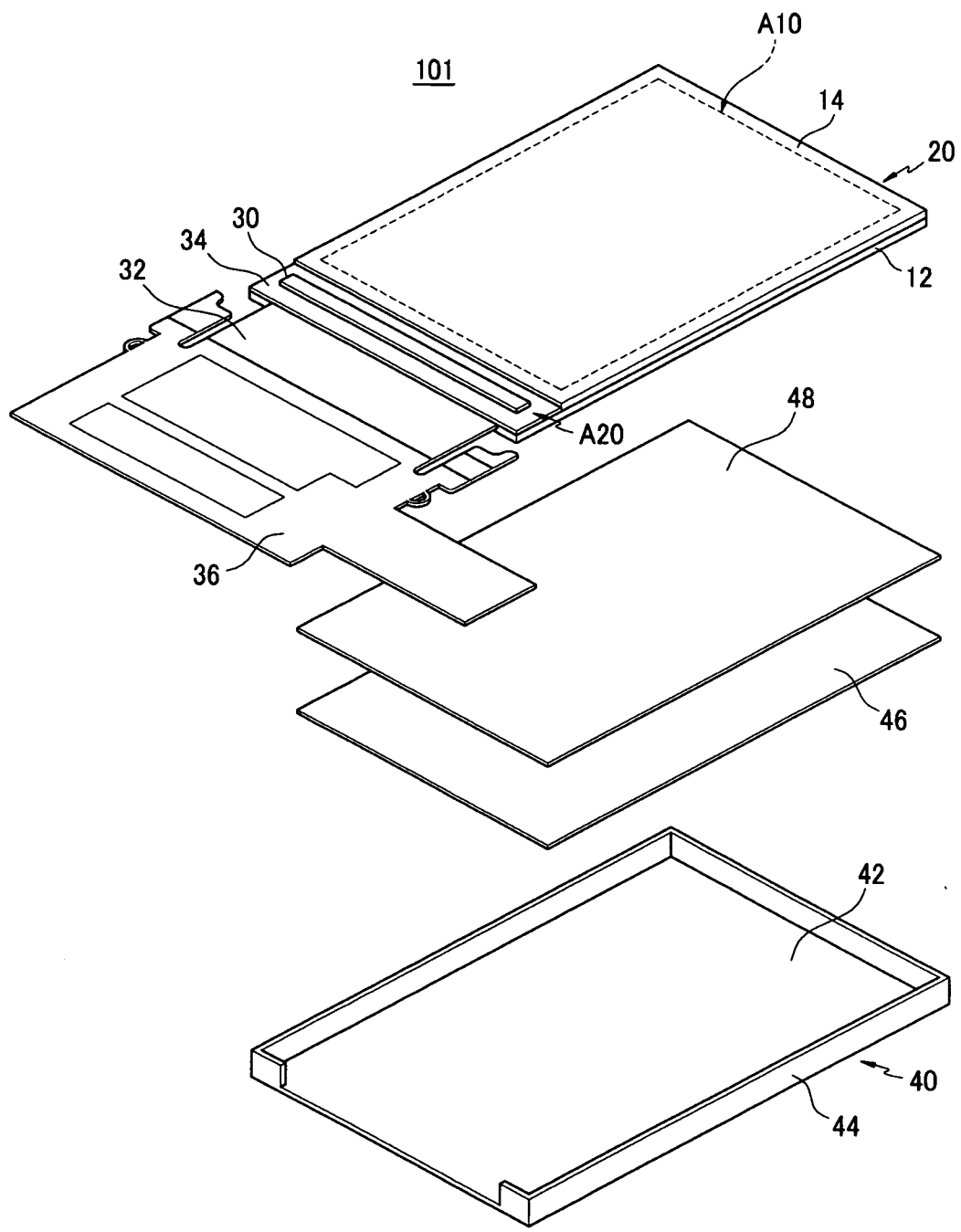
FIG. 1 is an exploded perspective view of an OLED display according to a first exemplary embodiment of the present disclosure.
Figure 2:
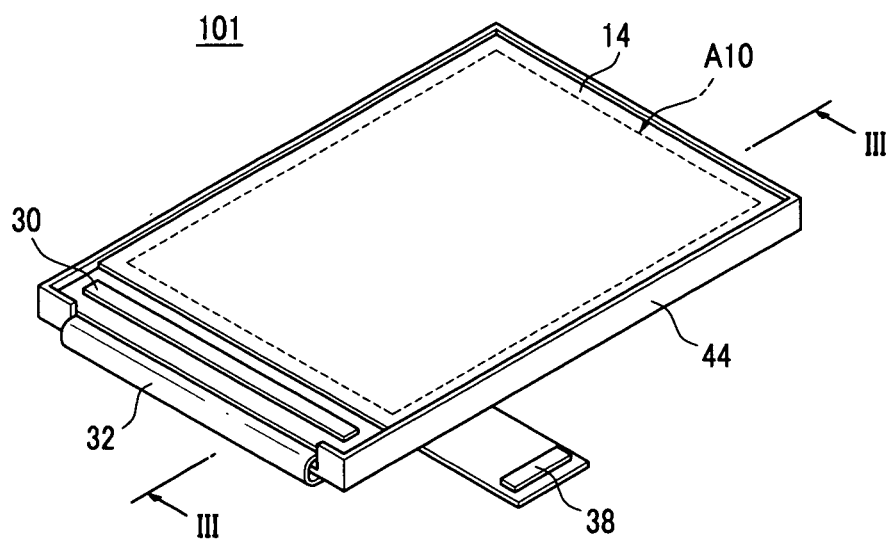
FIG. 2 is a perspective view of the OLED display of FIG. 1 when it is assembled.
Figure 3:
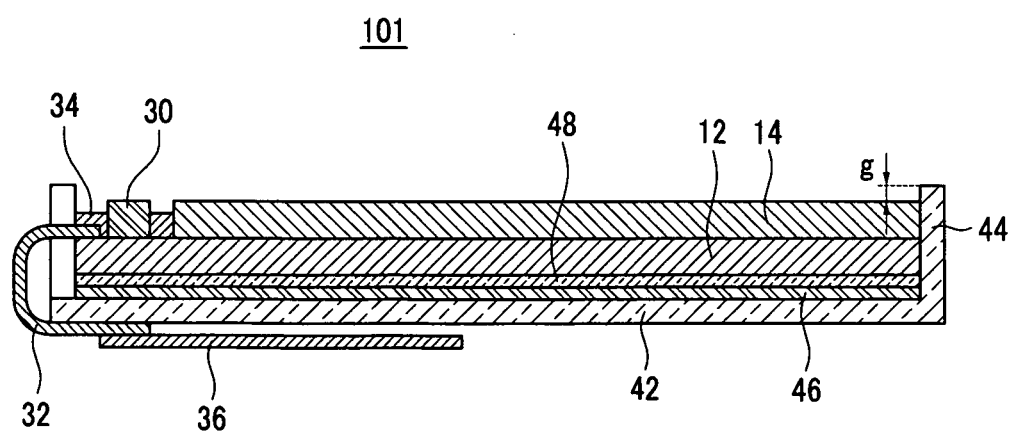
FIG. 3 is a cross-sectional view taken along line III-III of FIG. 2.

FIG. 1 is an exploded perspective view of an OLED display according to a first exemplary embodiment of the present disclosure, FIG. 2 is a perspective view of the OLED display of FIG. 1, and FIG. 3 is a cross-sectional view taken along line III-III of FIG. 2.

Referring to FIGS. 1 to 3, an OLED display 101 of the present exemplary embodiment includes a panel assembly 20 having a display region A10 and a pad region A20, a bezel 40 coupled to the panel assembly 20 at a rear side of the panel assembly 20, and a printed circuit board 36 electrically connected to the panel assembly 20 via a flexible printed circuit board 32. Images are displayed on the display region A10 of the panel assembly 20.

The panel assembly 20 includes a first substrate 12 and a second substrate 14 that is smaller than the first substrate 12 and has a peripheral portion coupled to the first substrate 12 by a sealant.

The display region A10 is defined at a portion of an overlapping region of the first and second substrates 12 and 14, which is surrounded by the sealant. The pad region A20 is defined at an outside of the sealant. A plurality of sub-pixels is disposed in a matrix pattern at the display region A10 of the first substrate 12. Scan and data drivers (not shown) for driving the sub-pixels are located between the display region A10 and the sealant, or at the outside of the sealant. Pads (not shown) for transferring electrical signals to the scan and data drivers are located at the pad region A20 of the first substrate 12.

Figure 4:
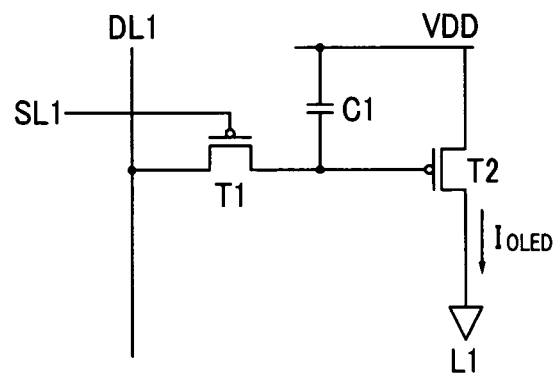
FIG. 4 is a schematic view of a sub-pixel circuit of a panel assembly depicted in FIG. 1.
Figure 5:
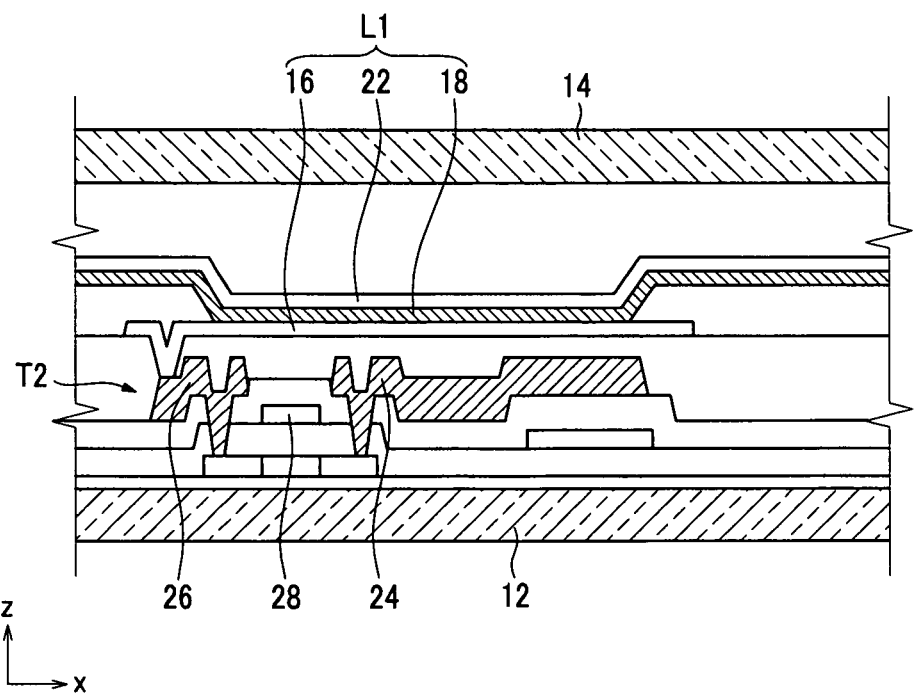
FIG. 5 is a partially enlarged cross-sectional view of a panel assembly depicted in FIG. 1.

FIG. 4 is a circuit diagram of a sub-pixel circuit of a panel assembly depicted in FIG. 1, and FIG. 5 is a partly enlarged cross-sectional view illustrating an internal structure of a panel assembly depicted in FIG. 1.

Referring to FIGS. 4 and 5, each of the sub-pixels of the panel assembly 20 includes an OLED L1 and a driving circuit unit. The OLED L1 includes an anode electrode 16, an organic light emitting layer 18, and a cathode electrode 22. The driving circuit unit includes at least two thin film transistors and at least one storage capacitor C1.

The thin film transistors include at least one switching transistor T1 and at least one driving transistor T2. The switching transistor T1 is connected to scan and data lines SL1 and DL1 to transfer a data voltage, which is input from the data line DL1 in accordance with a switching voltage input to the scan line SL1, to the driving transistor T2.

The storage capacitor C1 is connected to a voltage line VDD as well as to the switching transistor T1 to store a voltage corresponding to a difference between a voltage received from the switching transistor T1 and a voltage supplied to the power line VDD.

The driving transistor T2 is connected to both of the power line VDD and the storage capacitor C1 to supply an output current $I_{OLED}$, which corresponds to a square of a difference between a voltage stored in the storage capacitor C1 and a threshold voltage, to the OLED L1 so that the OLED L1 can emit light activated by the output voltage $I_{OLED}$. The driving transistor T2 includes a source electrode 24, a drain electrode 26, and a gate electrode 28. The anode electrode 16 of the OLED L1 is connected to the drain electrode 26 of the driving transistor T2. It should be construed that the above-described structure of the sub-pixels is exemplified only and may be variously modified.

The second substrate 14 is coupled to the first substrate 12 by the sealant at a predetermined interval to protect the driving circuit unit and the OLEDs on the first substrate 12 from an external environment. The second substrate 14 may be an upper substrate of the panel assembly 20. A moisture absorption agent may be applied on an inner surface of the second substrate 14.

Referring again to FIGS. 1 to 3, an integrated circuit chip 30 is mounted at the pad region A20 of the panel assembly 20 through a chip-on-glass (COG) method. The flexible printed circuit board 32 is mounted at the pad region A20 of the panel assembly 20 through a chip-on-film (COF) method.

A protective layer 34 is formed around the integrated circuit chip 30 and the flexible printed circuit board 32 to cover and protect pads formed at the pad region A20. A variety of electronic elements (not shown) for processing driving signals are mounted on the printed circuit board 36, and a connector 38 for transferring external signals to the printed circuit board 36 is also installed on the printed circuit board 36. The printed circuit board 32 fixed at the pad region A20 is folded toward a rear surface of the bezel 40 to face the rear surface of the bezel 40.

The bezel 40 includes a bottom portion 42, on which the panel assembly 20 is disposed, and sidewalls 44, which extend from side edges except a side edge at which the flexible printed circuit board 32 is bent. The sidewalls 44 extend toward the panel assembly 20 to partially cover a side surface of the panel assembly 20.

A double-sided adhesive tape 46 is disposed between the bottom portion 42 of the bezel 40 and the panel assembly 20 to fix the panel assembly 20 to the bezel 40.

It should be understood that the above described structure of the bezel is exemplified only and may be variously modified. For example, a flange (not shown) for enhancing strength may be formed on the edge of the bottom portion 42, at which the flexible printed circuit board 32 is bent.

The bezel 40 may be formed of metal having excellent strength and rigidity, such as stainless steel, cold rolled steel, aluminum, an aluminum alloy, a nickel alloy, and the like. Alternatively, the bezel 40 can be formed of a synthetic resin having excellent impact absorption/dispersion properties. For example, the bezel 40 may be formed of a polymer-based engineering plastic such as polycarbonate.

A surface stress enhancing member 48 for preventing the damage of the panel assembly 20 by an external impact is provided on a rear surface of the panel assembly 20 facing the bezel 40. The surface stress enhancing member 48 is attached on an outer surface of the first substrate 12 of the panel assembly 20 by a double-sided adhesive tape.

The panel assembly includes two glass substrates (the first and second substrates 12 and 14). When an external impact is applied to the glass substrate, compression force acts on the surface of the glass substrate and tension acts in the glass substrate, thereby breaking the glass substrate. When a user drops an electronic device having the OLED display 101, the external impact is transferred to the panel assembly 20 via the bezel 40. At this point, the surface stress enhancing member 48 disposed between the panel assembly 20 and the bezel 40 enhances the surface stress of the first substrate 12 to suppress the tension of the first substrate 12 that is generated by the external impact. Therefore, the damage of the first substrate 12 can be prevented. That is, since the surface stress enhancing member 48 enhances the impact-resistance of the panel assembly 20, the damage of the panel assembly 20 by the external impact can be prevented.

Figure 6:
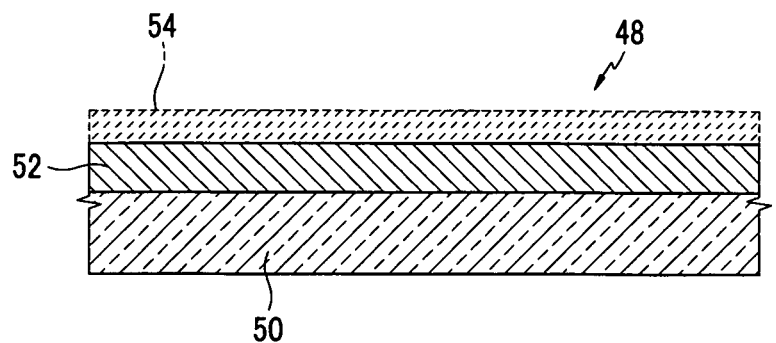
FIG. 6 is a cross-sectional view of a surface stress enhancing member of the OLED display of FIG. 1.

FIG. 6 illustrates the surface stress enhancing member in more detail. Referring to FIG. 6, the surface stress enhancing member 48 includes a hard coating layer 50, a pressure sensitive adhesive (PSA) layer 52 arranged on a surface of the hard coating layer 50, and a release liner 54 arranged on a surface of the PSA layer 52.

During manufacturing of the OLED display, the surface stress enhancing member 48 may be coupled to the panel assembly 20 by attaching the PSA layer 52 to an outer surface of the first substrate 12 in a state where the release liner 54 is removed from the PSA layer 52.

In the present exemplary embodiment, properties of the surface stress enhancing member 48 are as shown in the following table.

| | |
|---|---|
| Tensile strength (N/25 mm) | 240 |
| Elongation (%) | 120 |
| Transmittance of ultraviolet (UV) rays (%) | <1 |
| Transmittance (%) | 89 |
| Exterior transmittance (%) | 82 |
| Exterior reflectance (%) | 8 |
| Exterior absorption rate (%) | 10 |
| Adhesion (N/25 mm) | 12 |

Here, the tensile strength may be about 200 to 300 N/25 mm and the adhesion may be about 10 to 20 N/25 mm. The surface stress enhancing member 48 including the hard coating layer 50 and the PSA layer 52 can prevent damage of the panel assembly 20 while maintaining a thickness of 0.075 to 0.15 mm.

In addition, by increasing the thickness of the surface stress enhancing member 48 or forming each of the hard coating layer 50 and the PSA layer 52 with two layers stacked on one another, the shock absorption effect can be maximized. Here, a total thickness of the surface stress enhancing member 48 including a thickness of the double-sided adhesive tape 46 is about 0.11 to 0.19 mm, which does not affect the slimness of the OLED display 101.

The strength of the panel assembly 20 against an external impact is further enhanced by the surface stress enhancing member 48. This will be described in more detail hereinafter.

The inventor of the present application made an OLED display of Comparative Example 1 in which a double-sided adhesive tape is located between a 60.96-mm (2.4-inch) panel assembly and a bezel, an OLED display of Comparative Example 2 in which an adhesive shock absorption tape is located between a panel assembly and a bezel, and an OLED display of Example 1 in which a surface stress enhancing member and a double-sided adhesive tape are located between a panel assembly and a bezel.

In Comparative Example 1, thickness of the double-sided adhesive tape was 0.05 mm, in Comparative Example 2, thickness of the adhesive shock absorption tape was 0.26 mm, and in Example 1, thicknesses of the surface stress enhancing member and the double-sided adhesive tape were respectively 0.75 mm and 0.05 mm.

The OLED displays of Comparative Examples 1 and 2 and the OLED display of Example 1 were mounted in drop jigs and a series of drop impact resistance tests were performed by dropping the jigs from a height of 1.8 m to determine if the OLEDs were damaged.

Figure 7:
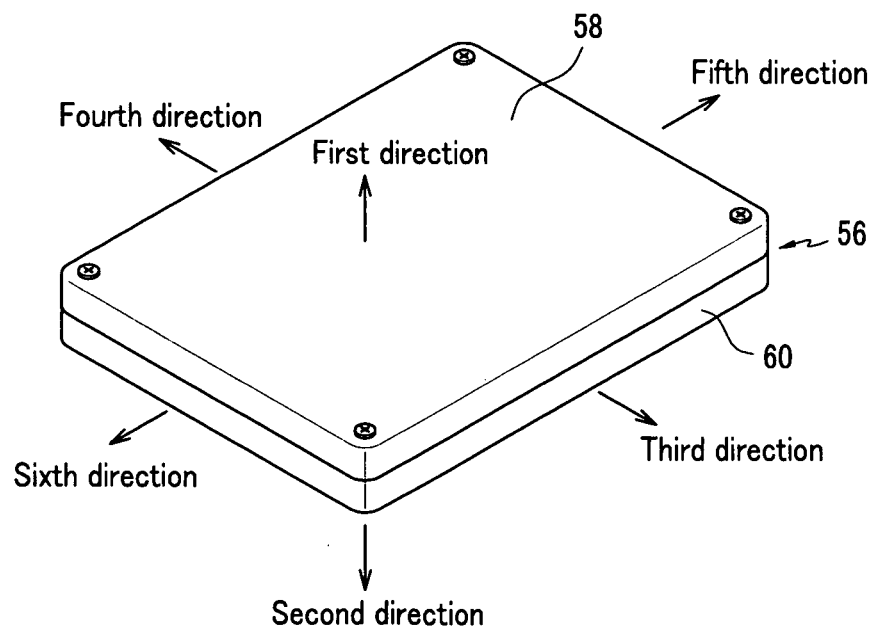
FIG. 7 is a schematic view of a drop jig used in a drop impact resistance test.

FIG. 7 is a schematic view of a drop jig used in a drop impact resistance test. Referring to FIG. 7, the drop jig 56 includes an upper case 58 and a lower case 60 that are coupled to each other by screws. The OLED display is mounted in a space defined by the upper and lower cases 58 and 60 of the drop jig 56. The drop jig 56 was dropped in the first through sixth directions indicated by six arrows corresponding to respective sides of the hexahedron drop jig 56. Four test samples were prepared for each of the OLED displays of Comparative Examples 1 and 2 and the OLED display of Example 1. The drop impact resistance test was performed 3 times (3 times for each of the six directions) for each of the OLED displays.

The following Table 1 shows test results evaluated by total points and average points for the OLED displays of Comparative Examples 1 and 2 and the OLED display of Example 1. The drop impact resistance points were calculated by giving 1 point when the panel assembly is not damage and by giving 0 points when the panel assembly is damaged.

TABLE 1

| | Drop impact resistance point | | | | | |
|---|---|---|---|---|---|---|
| | Sample 1 | Sample 2 | Sample 3 | Sample 3 | Total point | Average point |
| Comparative Example 1 (double-sided adhesive tape) | 7 | 7 | 5 | 1 | 20 | 5 |
| Comparative Example 2 (Shock absorption tape) | 7 | 10 | 10 | 1 | 28 | 7 |
| Example 1 (surface stress enhancing member and double-sided adhesive tape) | 15 | 3 | 18 | 4 | 40 | 10 |

As shown in Table 1, the OLED display of Example 1 having the surface stress enhancing member and the double-sided adhesive tape that are disposed between the panel assembly and the bezel have a higher drop impact resistance point than the OLEDs of Comparative Examples 1 and 2. This indicates that the OLED display of Example 1 has a better mechanical property against drop impact than the OLEDs of Comparative Examples 1 and 2.

In addition, the inventor of the present disclosure prepared electronic devices each having an OLED display of Comparative Examples 3, 4, and 5 in which only a double-sided adhesive tape was located between a 55.88-mm (2.2-inch) panel assembly and a bezel and an electronic device having an OLED display of Example 2 in which a surface stress enhancing member and a double-sided adhesive tape were located between a panel assembly and a bezel.

Properties of the OLED displays of Comparative Examples 3, 4, and 5 and properties of the OLED display of Example 2 are illustrated in the following Table 2. For reference, the reference character "g" in FIG. 3 indicates a distance between a top surface of the second substrate 14 and an upper end of the bezel 44.

TABLE 2

| | Thickness of first substrate (mm) | Thickness of second substrate (mm) | Distance between top surface of second substrate and upper end of bezel (mm) | Thickness of double-sided adhesive tape (mm) | Thickness of surface stress enhancing member (mm) |
|---|---|---|---|---|---|
| Comparative Example 3 | 0.4 | 0.4 | 0.1 | 0.05 | 0 |
| Comparative Example 4 | 0.5 | 0.5 | 0.1 | 0.05 | 0 |
| Comparative Example 5 | 0.5 | 0.5 | 0 | 0.05 | 0 |
| Example 2 | 0.4 | 0.4 | 0.03 | 0.05 | 0.07 |

Four test samples were prepared for each of the electronic devices having the OLED displays of Comparative Examples 3, 4, and 5 and the electronic device having the OLED display of Example 2. The drop impact resistance test was performed by dropping the samples from heights of 1.2 m and 1 m. The following Table 3 illustrates the test results.

TABLE 3

| Dropping height | Comparative Example 3 | Comparative Example 4 | Comparative Example 5 | Example 2 |
|---|---|---|---|---|
| 1.2 m | Two of four samples were damaged | Three of four samples were damaged | Two of four samples were damaged | No sample was damaged |
| 1 m | No sample was damaged | Three of four samples were damaged | One of four samples was damaged | No sample was damaged |

As illustrated in Table 3, it can be noted that all of the four samples of Example 2 where the OLED displays have the surface stress enhancing member were not damaged. This shows that the OLED display of Example 2 has a better mechanical property than the OLED displays of Comparative Examples 3, 4, and 5. As described above, the surface stress enhancing member 48 enhances the shock absorption effect of the panel assembly 20. Therefore, in the OLED display 101 of the present exemplary embodiment, damage of the panel assembly 20 by an external impact can be more effectively prevented.

Figure 8:
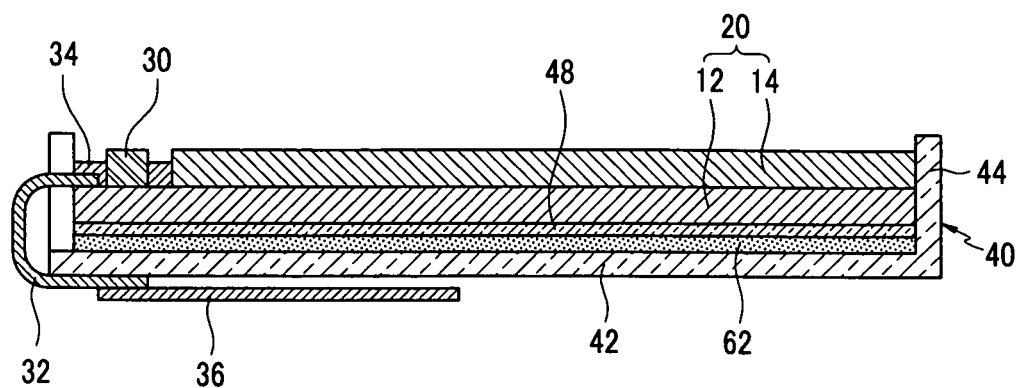
FIG. 8 is a cross-sectional view of an OLED display according to a second exemplary embodiment of the present disclosure.

FIG. 8 is a cross-sectional view of an OLED display according to a second exemplary embodiment of the present disclosure. Referring to FIG. 8, an OLED display of a second exemplary embodiment is the same as the OLED display of the first exemplary embodiment except that an adhesive shock absorption tape is used instead of the double-sided adhesive tape. In the first and second exemplary embodiments, like reference numerals are used to refer to like parts.

Figure 9:
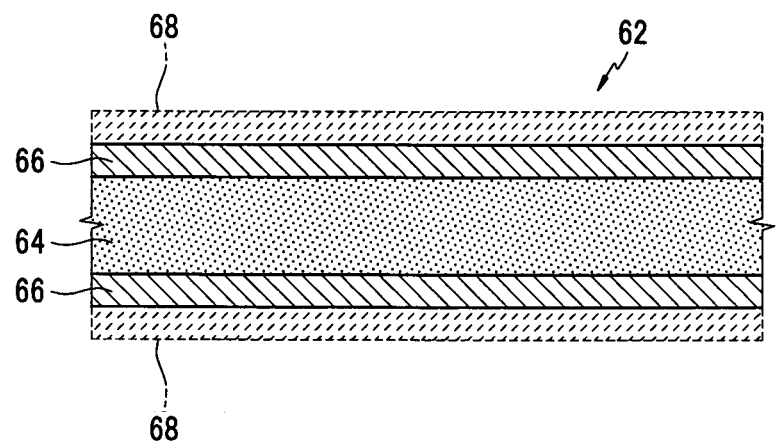
FIG. 9 is a partially enlarged perspective view of a shock absorbing tape of the OLED display of FIG. 8.

The shock absorption tape 62, as shown in FIG. 9, includes a shock absorption layer 64 having a shock absorption function, a pair of adhesive layers 66 formed on front and rear surfaces of the shock absorption layer 64, and release liners 68 located on outer surfaces of the adhesive layers 66. The release liners 68 are removed later so that one of the adhesive layers 66 is attached on the surface stress enhancing member 48 and the other of the adhesive layers 66 is attached on a bottom portion 42 of a bezel 40. The shock absorption layer 64 may include a sponge or urethane. The shock absorption tape 62 is thicker than the double-sided adhesive layer of the first exemplary embodiment.

In the present exemplary embodiment, as the OLED display 102 includes both the surface stress enhancing member 48 and the shock absorption tape 62, the impact resistance thereof is further enhanced, and damage by an external impact can be minimized.

Figure 10:
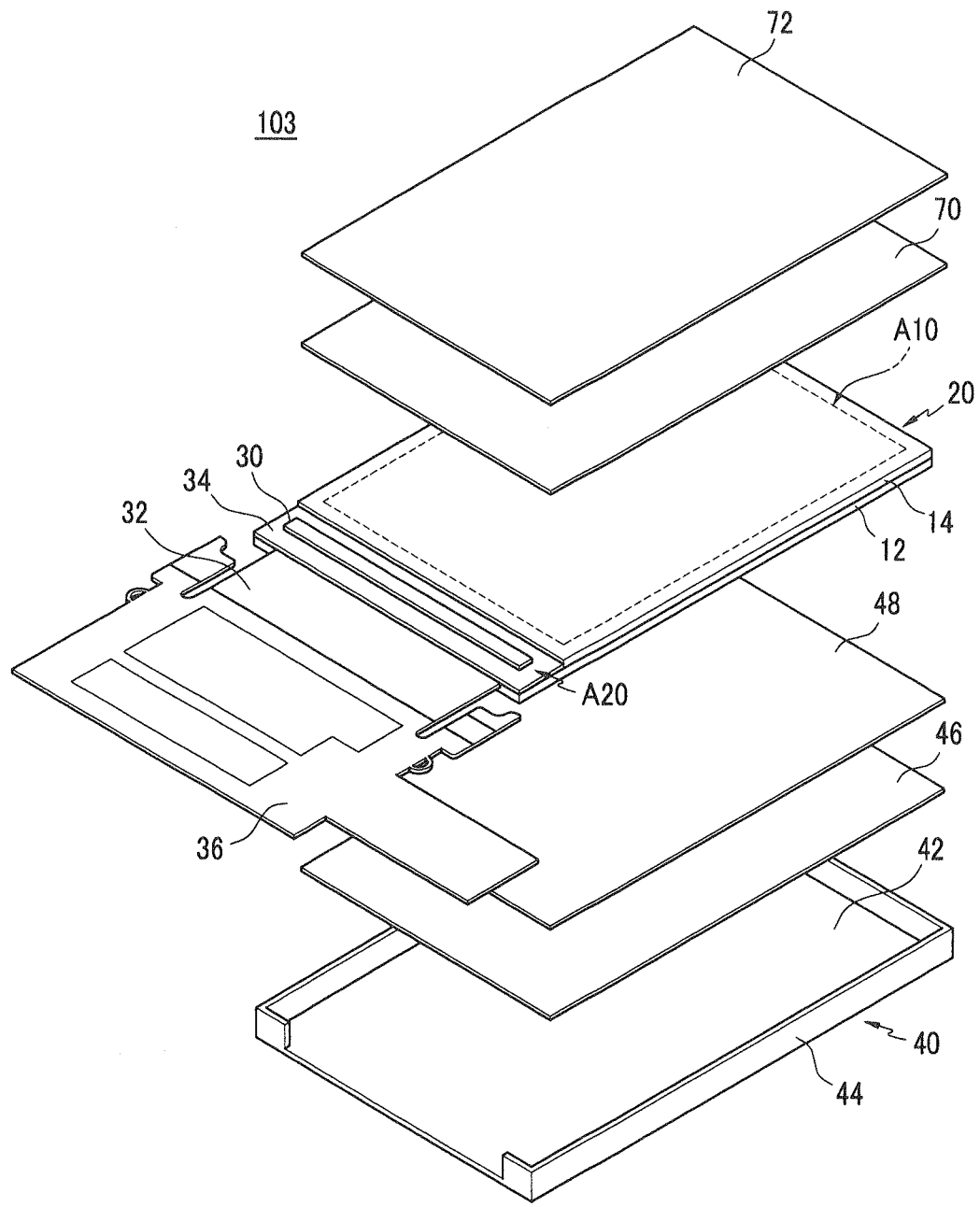
FIG. 10 is an exploded perspective view of an OLED display according to a third exemplary embodiment of the present disclosure.
Figure 11:
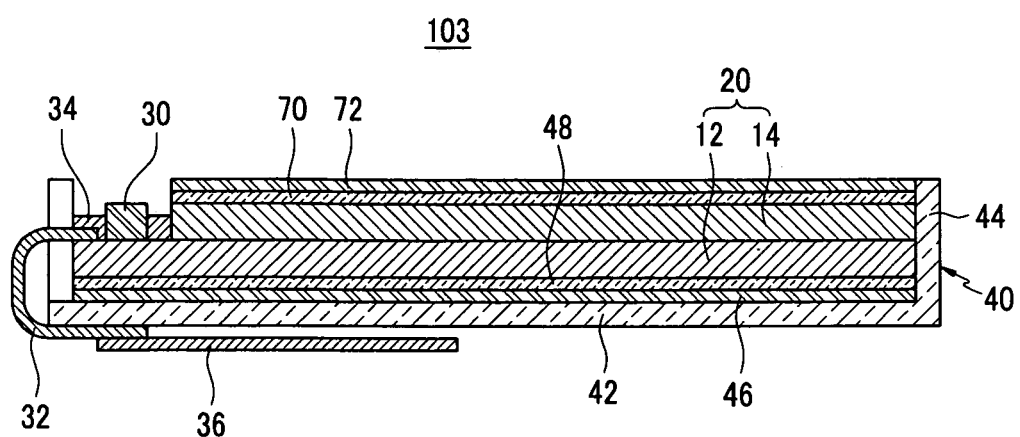
FIG. 11 is a cross-sectional view of the OLED display of FIG. 10.

FIGS. 10 and 11 illustrate an OLED display according to a third exemplary embodiment of the present disclosure. Referring to FIGS. 10 and 11, an OLED display 103 of the present exemplary embodiment includes a first surface stress enhancing member 48 located on a rear surface of a panel assembly 20 and a second surface stress enhancing member 70 located on a front surface of the panel assembly 20.

A double-sided adhesive tape or a shock absorption tape may be located between the first surface stress enhancing member 48 and a bezel 40. In FIGS. 10 and 11, the double-sided adhesive tape 46 is exemplarily located between the first surface stress enhancing member 48 and the bezel 40.

The second surface stress enhancing member 70 is attached on an outer surface of the second substrate 14. As the surface stress of the second substrate 14 is enhanced, the tensile force of the second substrate 14, which is generated when the external force is applied, is suppressed, and thus the damage of the second substrate 14 can be prevented. The internal structure of the second surface stress enhancing member 70 is the same as that of the first surface stress enhancing member 48 described in the first exemplary embodiment.

Meanwhile, a polarizing plate 72 may be located on a front surface of the second surface stress enhancing member 70. The polarizing plate 72 polarizes incident light from an external side and functions to suppress a phenomenon that the polarized light is reflected in the OLED display and is subsequently transmits to the external side. Therefore, the OLED display 103 having the polarizing plate 72 prevents the reflection of the external light, thereby improving a visual perception.

Figure 12:
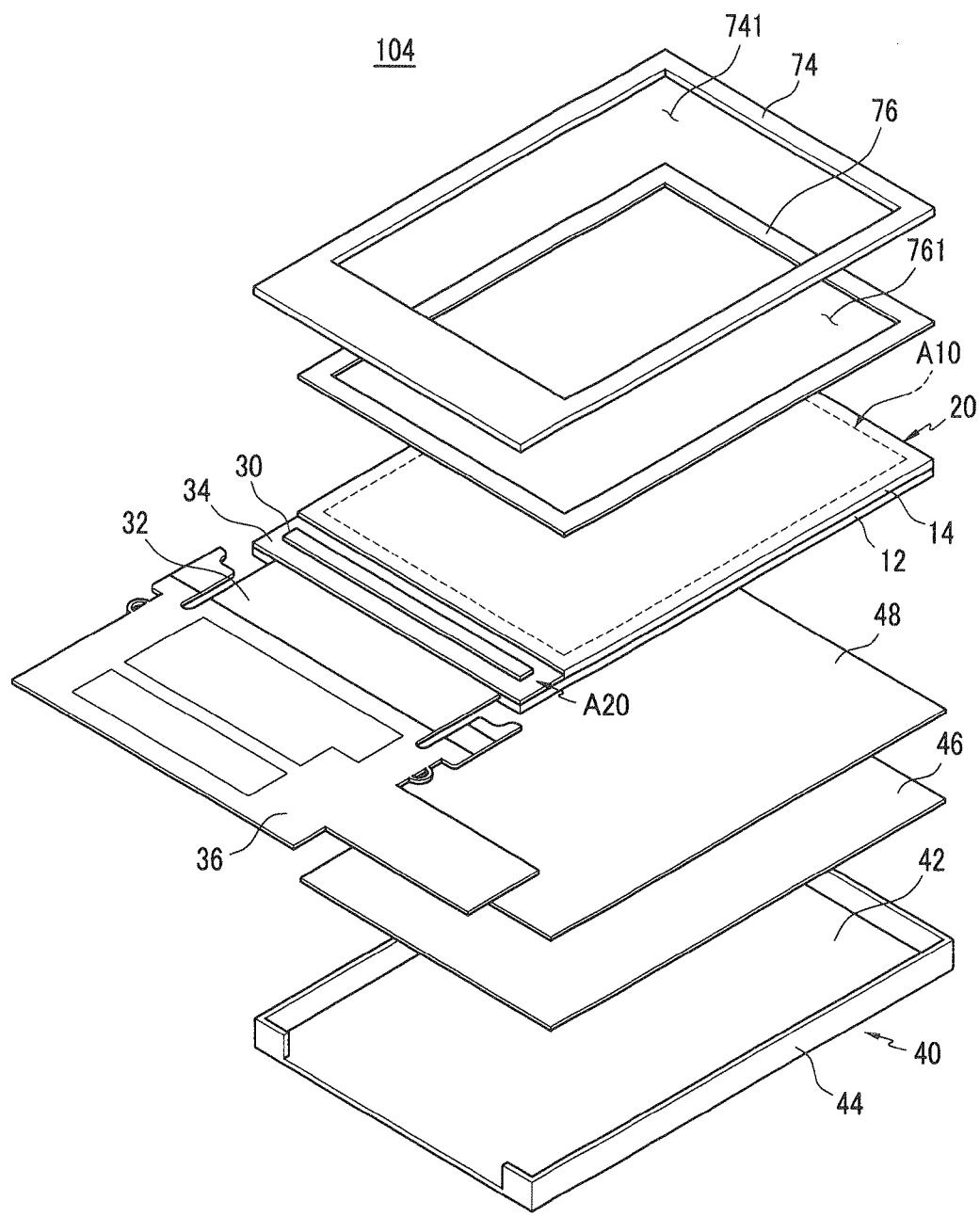
FIG. 12 is an exploded perspective view of an OLED display according to a fourth exemplary embodiment of the present disclosure.
Figure 13:
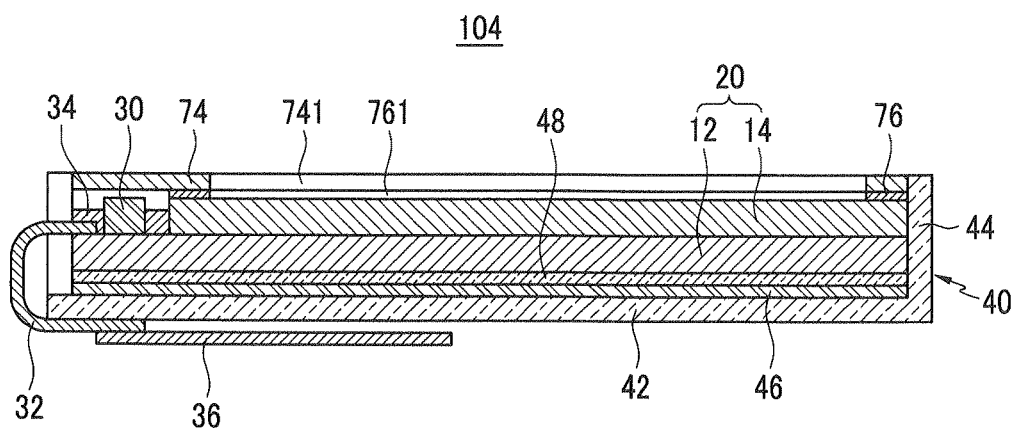
FIG. 13 is a cross-sectional view of the OLED display of FIG. 12.

FIGS. 12 and 13 illustrate an OLED display according to a fourth exemplary embodiment of the present disclosure. Referring to FIGS. 12 and 13, an OLED display 104 of the present exemplary embodiment includes a lower bezel 40 arranged on a rear surface of a panel assembly 20 and an upper bezel 74 arranged on a front surface of the panel assembly 20. That is, the present exemplary embodiment is identical to the first through third exemplary embodiments except that the present exemplary embodiment further includes the upper bezel 74. FIGS. 12 and 13 show a structure that is exemplarily the same as that of the first exemplary embodiment except for the upper bezel 74.

The upper bezel 74 is formed of a plate having a predetermined thickness. The upper bezel 74 may have the same size as the first substrate 12 of the panel assembly 20. The bezel 74 may be formed of the same material as the lower bezel 40.

The panel assembly 20 may further include a first double-sided adhesive tape located between the panel assembly 20 and the lower bezel 40, and a second double-sided adhesive tape for attaching the bezel 74 to a front surface of the second substrate 14.

The bezel 74 and the second double-sided adhesive tape 76 are respectively provided with openings 741 and 761 for exposing the display region.

According to the OLED display 104 of the present exemplary embodiment, since the upper bezel 74 covers and protects the pad region A20 of the panel assembly 20, the mechanical strength of the OLED display 104 can be further enhanced. Particularly, the mechanical strength of the pad region A20 can be further enhanced.

Figure 14:
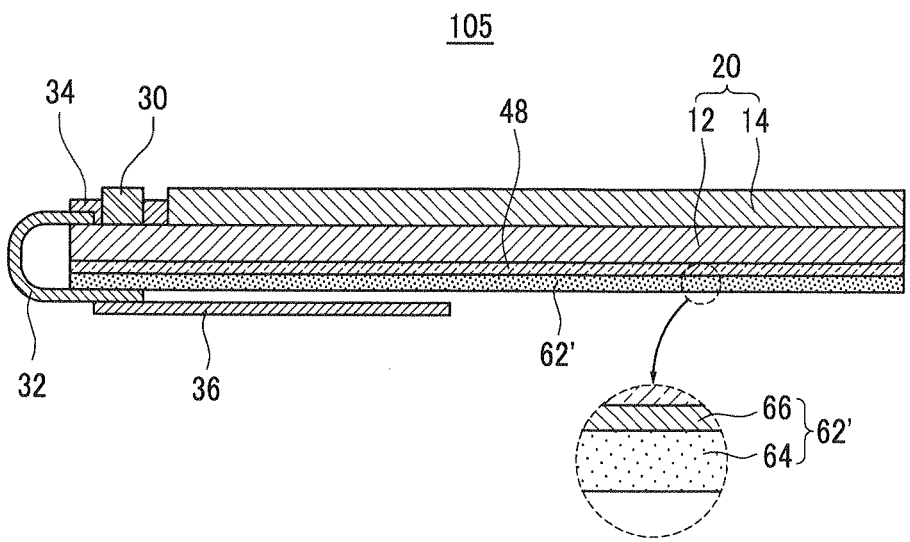
FIG. 14 is a cross-sectional view of an OLED display according to a fifth exemplary embodiment of the present disclosure.

FIG. 14 illustrates an OLED display according to a fifth exemplary embodiment of the present disclosure. Referring to FIG. 14, an OLED display of the present exemplary embodiment does not include a bezel but is constructed to suppress an external impact applied to the panel assembly 20 by providing a surface stress enhancing member 48 to a rear surface of the panel assembly 20.

A shock absorption tape 62' may be located on an outer surface of the surface stress enhancing member 20. The shock absorption tape 62' includes a shock absorption layer 64 having a shock absorption function and an adhesive layer 66 located on a surface of the shock absorption layer 64 facing the surface stress enhancing member 48.

Figure 15:
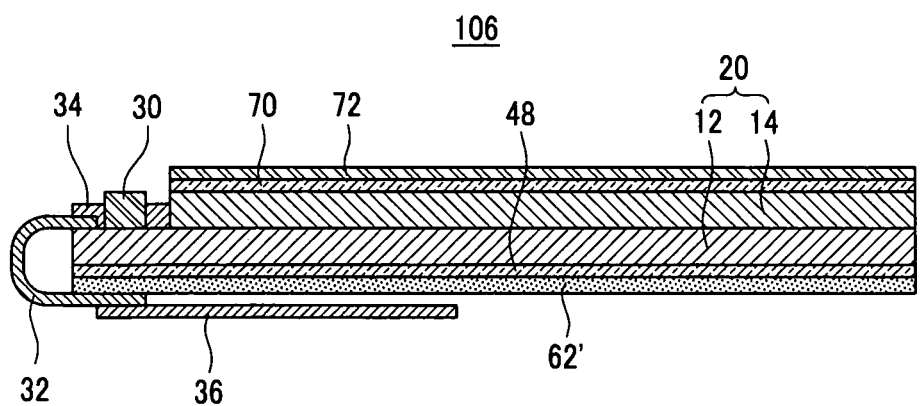
FIG. 15 is a cross-sectional view of an OLED display according to a sixth exemplary embodiment of the present disclosure.

FIG. 15 illustrates an OLED display according to a sixth exemplary embodiment of the present disclosure. Referring to FIG. 15, an OLED display of the present exemplary embodiment does not include a bezel. The OLED display is configured to suppress an external impact applied to a panel assembly by providing a first surface stress enhancing member 48 on a panel assembly 20 and a second surface stress enhancing member 70 on a front surface of the panel assembly 20.

A shock absorbing tape 62' may be located on a rear surface of the first surface stress enhancing member 48. A polarizing plate 72 may be located on a front surface of the second surface stress enhancing member 70.

In the OLED displays 105 and 106 of the respective fifth and sixth exemplary embodiments, the impact resistance of the panel assembly 20 can be enhanced by the surface stress enhancing member 48 or the first and second surface stress enhancing members 48 and 70 without using the bezel. Therefore, the OLED displays 105 and 106 can be manufactured to be slimmer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
a panel assembly comprising a display region for displaying an image and a pad region, the display region including a plurality of organic light emitting diodes for emitting, light;
a first surface stress enhancing member arranged on a rear surface of the panel assembly, the first surface stress enhancing member being directly attached to the rear surface of the panel assembly, the first surface stress enhancing member having a tensile strength of 200 N/25 mm to 300 N/25 mm, the first surface stress enhancing member comprising a hard coating, layer and a pressure sensitive adhesive layer arranged on a surface of the hard coating layer, the pressure sensitive adhesive layer disposed between the surface of the hard coating layer and the rear surface of the panel assembly
a lower bezel arranged on a rear surface of the first surface stress enhancing member; and
a double-sided adhesive tape arranged between the first surface stress enhancing member and the lower bezel, the double-sided adhesive tape directly attached to the first surface stress enhancing member and to the lower bezel.

2. The organic light emitting diode display of claim 1, further comprising a second surface stress enhancing member arranged on a front surface of the panel assembly.

3. The organic light emitting diode display of claim 2, further comprising a polarizing plate arranged on a front surface of the second surface stress enhancing member.

4. The organic light emitting diode display of claim 2, wherein the second surface stress enhancing member comprises a hard coating layer and a pressure sensitive adhesive layer arranged on a surface of the hard coating layer.

5. The organic light emitting, diode display of claim 4, wherein the second surface stress enhancing member has a tensile strength of 200 N/25 mm to 300 N/25 mm.

6. The organic light emitting diode display of claim 4, wherein the second surface stress enhancing member has an adhesion of 10 N/25 mm to 20 N/25 mm.

7. The organic light emitting diode display of claim 1, wherein the lower bezel comprises a bottom portion covering, the rear surface of the first surface stress enhancing member and a sidewall located at edge portions of the bottom portion except an edge portion corresponding to the pad region.

8. The organic light emitting diode display of claim 7, further comprising an upper bezel arranged in a from surface of the panel assembly.

9. The organic light emitting diode display of claim 8, wherein the upper bezel covers the pad region, and is provided with an opening exposing the display region.

10. The organic light emitting diode display of claim 8, wherein each of the lower and upper bezels is formed of metal or synthetic resin.

11. The organic light emitting diode display of claim 1, wherein the first surface stress enhancing member has an adhesion of 10 N/25 mm to 20 N/25 mm.

* * * * *